United States Patent
Rhee et al.

(10) Patent No.: US 6,927,611 B2
(45) Date of Patent: Aug. 9, 2005

(54) SEMIDIGITAL DELAY-LOCKED LOOP USING AN ANALOG-BASED FINITE STATE MACHINE

(75) Inventors: Woogeun Rhee, Norwood, NJ (US); Sergey V. Rylov, White Plains, NY (US); Daniel Friedman, Sleepy Hollow, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/696,139

(22) Filed: Oct. 29, 2003

(65) Prior Publication Data

US 2005/0093591 A1 May 5, 2005

(51) Int. Cl.$^7$ ................................ H03L 7/06
(52) U.S. Cl. .................................. 327/149; 327/158
(58) Field of Search ............................ 327/149, 150, 327/153, 156, 158, 159, 161; 331/25; 375/373, 375/374, 375, 376

(56) References Cited

U.S. PATENT DOCUMENTS 6,043,717 A  *  3/2000  Kurd ............................. 331/17
6,650,157 B2 * 11/2003  Amick et al. ................ 327/158

OTHER PUBLICATIONS

Sidiropoulos et al., "A Semidigital Dual Delay-Locked Loop", IEEE Journal of Solid-State Circuits, vol. 32, No. 11, Nov. 1997, pp. 1683-1692.

* cited by examiner

Primary Examiner—Linh My Nguyen
(74) Attorney, Agent, or Firm—Duke W. Yee; Theodore D. Fay, III

(57) ABSTRACT

A low-power full-rate semidigital DLL architecture using an analog-based FSM (AFSM). The AFSM is a mixed-mode FSM in which analog integration is substituted for digital filtering, thus enabling a lower power implementation of the clock and data recovery function. An integrated voltage is converted to a digital code by an analog-to-digital converter (ADC), and the digital code is used either directly or after (low frequency) digital signal processing to control a controllable delay element, such as, a phase rotator, for data edge tracking.

16 Claims, 4 Drawing Sheets

SEMIDIGITAL DELAY-LOCKED LOOP USING AN ANALOG-BASED FINITE STATE MACHINE

BACKGROUND OF THE INVENTION

1. Technical Field

The present invention relates generally to serial link data communications systems, and in particular, to clock and data recovery systems. Still more particularly, the present invention relates to a delay-locked loop circuit used to sample data based on a periodic clock signal.

2. Description of Related Art

In one common approach to serial data communications, clock information is not explicitly sent by a transmitter over the link, but is instead embedded in the data being transferred. In order to recover the data at the receiver, the clock signal must be extracted from this data stream. There are many approaches that may be used to solve this problem. One such approach is the use of a clock and data recovery phase-locked loop (PLL), in which the action of the loop adjusts the phase of an oscillator within the PLL to enable proper sampling of the incoming data. A second approach involves the use of a conventional delay-locked loop (DLL), offering smaller area, guaranteed stability, and better immunity against power supply noise. However, the use of conventional DLL circuits are limited in clock and data recovery (CDR) applications mainly because of the finite phase capture range of these types of circuits. A third approach to the clock and data recovery problem involves the use of a semidigital DLL. Compared to a conventional DLL circuit, a semidigital DLL circuit provides a phase shift by using a phase rotator under the control of a digital finite state machine (FSM). The use of a phase rotator in place of a finite-range delay line gives the semidigital DLL circuit an infinite phase capture range. This feature extends the usefulness of DLL circuits in CDR applications and even enables the circuit to track input data frequency drift to a certain degree. A semidigital DLL architecture offers advantages in multi-channel applications because a clock from a single voltage controlled oscillator (VCO) can be shared by multiple DLL circuits, saving clock generation area and mitigating crosstalk issues.

Turning to FIG. 1, a block diagram of a known semidigital DLL-based CDR using a phase rotator is shown. This prior art CDR includes DLL or PLL circuit 100, phase rotator 102, phase detector/sampler (PD/S) 104, and digital finite state machine (FSM) 106. DLL or PLL circuit 100 receives a clock reference signal, $CLK_{ref}$. The output of DLL or PLL circuit 100 is input into phase rotator 102. In turn, phase rotator 102 generates an output clock signal, $CLK_{out}$ at a frequency commensurate with that of $CLK_{ref}$ and with a phase shift controlled by the action of the phase rotator. Phase detector/sampler 104 receives a digital data stream, $DAT_{in}$, and a clock signal, $CLK_{out}$, used to generate information about the phase relationship between $CLK_{out}$ and $DAT_{in}$, and to sample $DAT_{in}$. Phase detector/sampler 104 also generates an output data stream, $DAT_{out}$. Phase detector/sampler 104 generates up (UP) or down (DN) signals in a digital data stream, which is received by digital finite state machine (FSM) 106. In turn, digital finite state machine 106 processes this information to produce appropriate control signals which are sent to phase rotator 102.

The operation of phase rotator 102 is based on the combination of phase selection and phase interpolation. Phase rotator 102 requires a multiphase input clock signal. In this circuit, output phases are generated by interpolating between weighted adjacent input phases. By choosing which phases have non-zero weights and by controlling the values of these weights, arbitrary phase shifting can be achieved. The multiphase clock signal may be generated in different ways, including being taken from an appropriate stage in a ring voltage controlled oscillator or by phase generation in the DLL from a single supplied phase.

SUMMARY OF THE INVENTION

Normally, the implementation of potentially complicated phase capture algorithms is relatively straightforward because loop filtering is performed in a semidigital DLL circuit by FSM. In an all digital FSM, however, this implementation consumes substantial power as the operating frequency increases. Half-rate and full-rate architectures have been developed to address these power consumption issues. These architectures, however, also must address the mismatch problem in multiphase clock distribution, so as not to incur an unacceptable deterministic jitter (DJ) performance penalty. In general, the half-rate architecture doubles the hardware complexity and the power saving that occurs due to the half-rate topology may not be substantial when a differential current-mode logic (CML) is employed for digital blocks. Therefore, a full-rate architecture is considered desirable if power consumption of the FSM can be reduced.

Therefore, it would be advantageous to have at least an improved delay-locked loop circuit that provides a full-rate architecture with reduced power consumption. The present invention provides a low-power full-rate semidigital DLL architecture using an analog-based FSM (AFSM). The AFSM is a mixed-mode FSM in which analog integration is substituted for digital filtering, thus enabling a lower power implementation of the clock and data recovery function. An integrated voltage is converted to a digital code by an analog-to-digital converter (ADC), and the digital code is used either directly or after (low frequency) digital signal processing to control a a controllable delay element, such as, a phase rotator, for data edge tracking.

BRIEF DESCRIPTION OF THE DRAWINGS

The invention as well as a preferred mode of use, further objectives, and advantages thereof, will best be understood by reference to the following detailed description of an illustrative embodiment when read in conjunction with the accompanying drawings, wherein.

DETAILED DESCRIPTION

Figure 1:
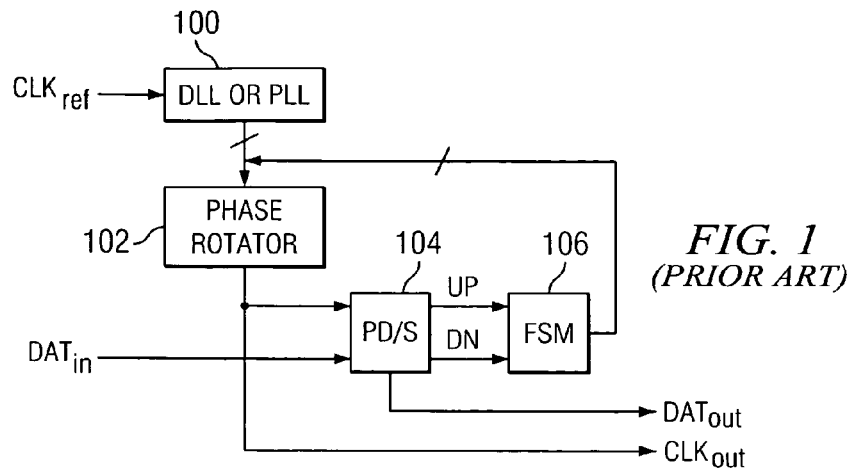
FIG. 1 is a block diagram of a known semidigital DLL circuit.
Figure 2:
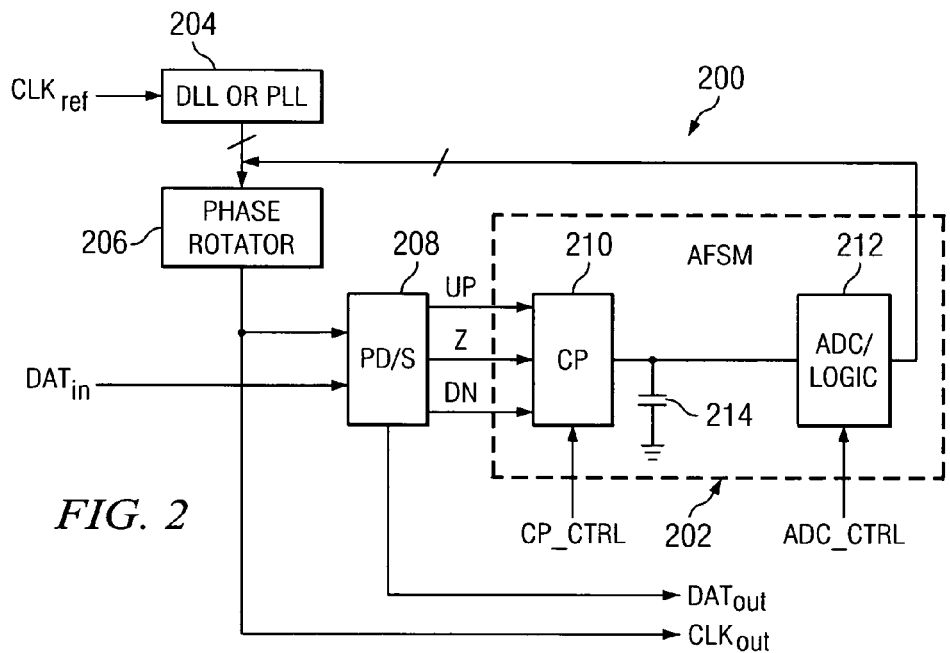
FIG. 2 is a diagram of a semidigital delay-locked loop circuit using an analog-based finite state machine in accordance with an illustrative embodiment.

With reference now to the figures and in particular with reference to FIG. 2, a diagram of a semidigital delay-locked loop circuit is depicted in accordance with an illustrative embodiment. Semidigital delay-locked loop circuit 200 provides a low power full-rate semidigital DLL architecture using an analog based finite state machine, AFSM 202. Semidigital delay-locked loop circuit 200 also includes DLL or PLL circuits 204, phase rotator 206, and phase detector/sampler (PD/S) 208. DLL or PLL circuit 204 receives a reference clock signal, $CLK_{ref}$, generates multiple phases of a clock at a frequency related to that of $CLK_{ref}$, and sends these output phases to phase rotator 206. In the illustrative examples, phase rotator 206 is a linear phase shifting circuit. The phase of a signal may be discretely or continuously adjusted over a range from 0° to 360°, depending on how the control signals to the phase rotator 206 is provided. One common method for generating the multiphase clock required by a phase rotator is to divide the frequency of an input clock by two, thus generating quadrature phases at half the frequency of the input clock. Other means of multiphase clock generation are known in the art and are appropriate for use in conjunction with the concepts set forth in this invention. In the case of a frequency divider-based multiphase generator, the phase shifting circuitry may be connected to the divider outputs and may consist of a pair of differential amplifiers and other control circuitry depending on the particular embodiment. A frequency doubling circuit may follow the phase shifter. The signal, having its phase adjusted, may then pass through an output buffer. Additionally, other inputs may include digital control inputs. These control inputs may adjust parameters, such as, for example, phase and temperature coefficients. Of course, phase rotator 206 may be implemented using numerous other architectures known in the art.

In turn, phase rotator 206 outputs a clock signal, $CLK_{out}$, which is received by phase detector/sampler (PD/S) 208. This clock signal is used by phase detector/sampler 208 to sample a digital data stream, $DAT_{in}$. Further, phase detector/sampler 208 outputs a data stream, $DAT_{out}$, as well as an up signal (UP), a down signal (DN), and a tristate (Z) signal. In the case where the phase rotator provides a full-rate clock as its output, phase detector/sampler 208 compares the phase of two input signals against each other. In this embodiment, one of these signals is a clock output from the phase rotator 206 and the second signal is the input digital data stream, $DAT_{in}$. Phase detector/sampler 208 produces an output that encapsulates information about the phase relationship between its inputs, in particular, which input is leading and by how much. Output signals from phase detector/sampler 208 are generated in response to this determination. These output signals are then processed in the charge pump 210, loop filter 214, and ADC/logic 212 blocks to create a feedback signal that can be used to adjust the phase of the rotator output signal. The outputs from phase detector/sampler 208 are typically up and down signals used to control a charge pump, such as charge pump 210 in FIG. 2. A simple version of a phase detector may be implemented using delay lines and simple logic circuitry such as AND gates or exclusive OR (XOR) gates. The up, down, and tristate signals are received by AFSM 202. AFSM 202 includes a charge pump (CP) 210 and analog-to-digital circuit (ADC)/logic circuit 212. Additionally, AFSM 202 includes loop filter 214, which contains a capacitor. Charge pump 210 receives up, down, and tristate signals from phase detector/sampler 208. These signals are used to generate an output signal that is sent to ADC/logic circuit 212. In turn, ADC/logic circuit 212 generates a control signal that is used to control phase rotator 206.

Although the use of AFSM 202 shown in the illustrative embodiments is not limited to full-rate systems, this approach provides more power reduction as compared to conventional semidigital approaches when this circuit operates at higher frequencies. AFSM 202, in these examples, is a mixed-mode finite state machine in which analog integration is substituted for digital filtering. In the illustrative examples, an integrated voltage is converted to digital code by an analog-to-digital converter within ADC/logic circuit 212. This digital code is used either directly or after low frequency digital signal processing to control phase rotator 206. Depending on the particular implementation, other types of controllable delay elements used for edge tracking may be used in place of phase rotator 206. In these examples, a low speed ADC is acceptable for this application. This low speed ADC allows the analog-to-digital conversion to be executed at a low power. Charge pump 210 in AFSM 202 is used to convert up and down voltage wave forms received from phase detector 208 into a charge on integration capacitor 214. By including tristate operation in phase detector 208, data pattern dependent jitter is reduced. In this embodiment, the tristate signal generated by phase detector 208 causes charge pump 210 to ignore input up and down signals when data transitions are absent, but other tristate schemes are also contemplated in the context of this invention.

Figure 3:
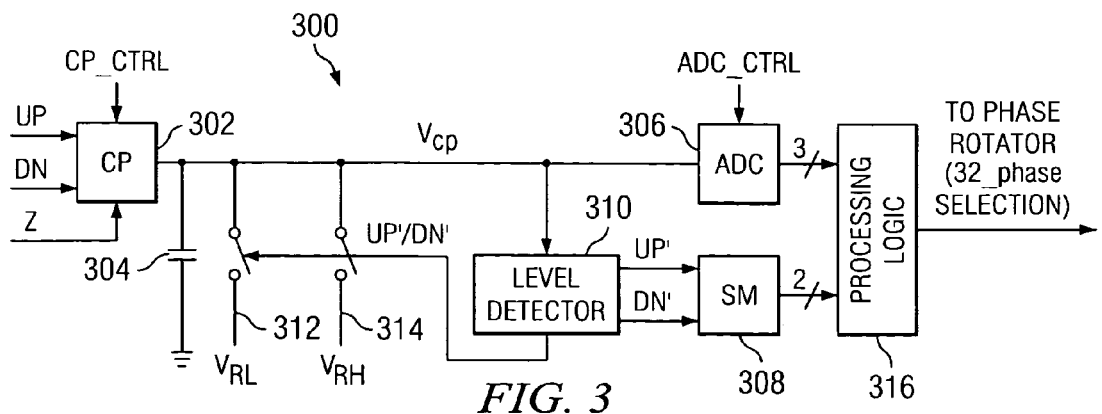
FIG. 3 is a diagram illustrating an exemplary analog finite state machine (AFSM) implementation in accordance with an illustrative embodiment.

Control of CDR loop parameters, including bandwidth, can be implemented in different ways, including implementing a digitally programmable charge pump, ADC threshold adjustment, and modification of load frequency logic algorithms that generate phase rotator or delay line control signals. Flywheel operation, in which frequency offsets between the reference clock and the clock generating the input data are compensated, may be a desirable operating mode for a CDR circuit. In phase rotator-based designs, flywheel operation is achieved by controlling the phase rotator so that it regularly takes extra phase steps in proportion to the clock/data frequency offset. Flywheel operation can be achieved in the context of this invention using an analog approach, using, for example, ADC threshold biasing and/or charge pump mismatch. In these illustrative examples, the signal CP_CTRL is received by charge pump 210 is a control word that may be used to control, for example, loop bandwidth by setting absolute charge pump current and flywheel operation by setting charge pump mismatch. Similarly, the ADC/logic block control input ADC_CTRL may be used to control, for example, loop bandwidth by setting ADC threshold values and flywheel operation by setting threshold asymmetries. The CP_CTRL and ADC_CTRL signals may be in digital or analog form and could be implemented as one or more inputs. Turning now to FIG. 3, a diagram illustrating an exemplary analog-based finite state machine (AFSM) implementation is depicted in accordance with an illustrative embodiment. In this depicted example, AFSM 300 includes charge pump (CP) 302, capacitor 304, analog-to-digital converter (ADC) 306, state machine (SM) 308, level detector 310, switch 312, switch 314, and processing logic 316. Charge pump 302 receives up and down signals from a phase detector, such as phase detector 208 in FIG. 2. The sampling of these signals is controlled by an input into charge pump 302 that receives a tristate signal. Additionally, charge pump 302 also receives CP_CTRL signals.

ADC 306 generates bits used for phase interpolation. ADC 306 also receives ADC_CTRL signals. In this example, a series of 8 bits are generated for use by a phase rotator, such as phase rotator 206 in FIG. 2. State machine 308 generates bits used by a phase rotator for phase selection. In these depicted examples, 2 bits are generated for the phase selection. In the illustrative examples, these bits are used to select a phase boundary among the following: (0°, 90°), (90°, 180°), (180°, 270°), and (270°, 360°).

Switches 312 and 314 are used to reset voltage levels when a lower voltage threshold, $V_L$, or an upper voltage threshold, $V_H$, is reached. Each time a logic "1" signal is output by charge pump 302, the voltage level is incremented by one level and each time logic "0" is output by charge pump 302, the voltage is lowered by one level. In these examples, eight different voltage levels are used with switches 312 and 314 used to reset the voltage levels when the thresholds are reached.

In the illustrative examples, the output from ADC 306 and state machine 308 generates control signals that are sent to the phase rotator. These control signals select which pair of phases will be used in the interpolation operation and also increment and decrement the weight control vectors for the interpolator as appropriate. In the example implementation, 32 phase steps per bit time are present. Thus, in this case the minimum algorithmic jitter is equivalent to $\frac{1}{32}$ of the clock period. As illustrated in FIG. 3, phase interpolation is controlled by the 3 bit ADC output from ADC 306. The current invention also contemplates the case in which the ADC output is further processed by an additional logic block prior to its use in control of the phase interpolator. Phase selection is controlled by the output of state machine 308. The output from ADC 306 and state machine 308 are used by processing logic 316 to generate an output to the phase rotator in these examples. ADC 306 and processing logic 316 are components that may be used to form ADC/logic 212 in FIG. 2.

Figure 4:
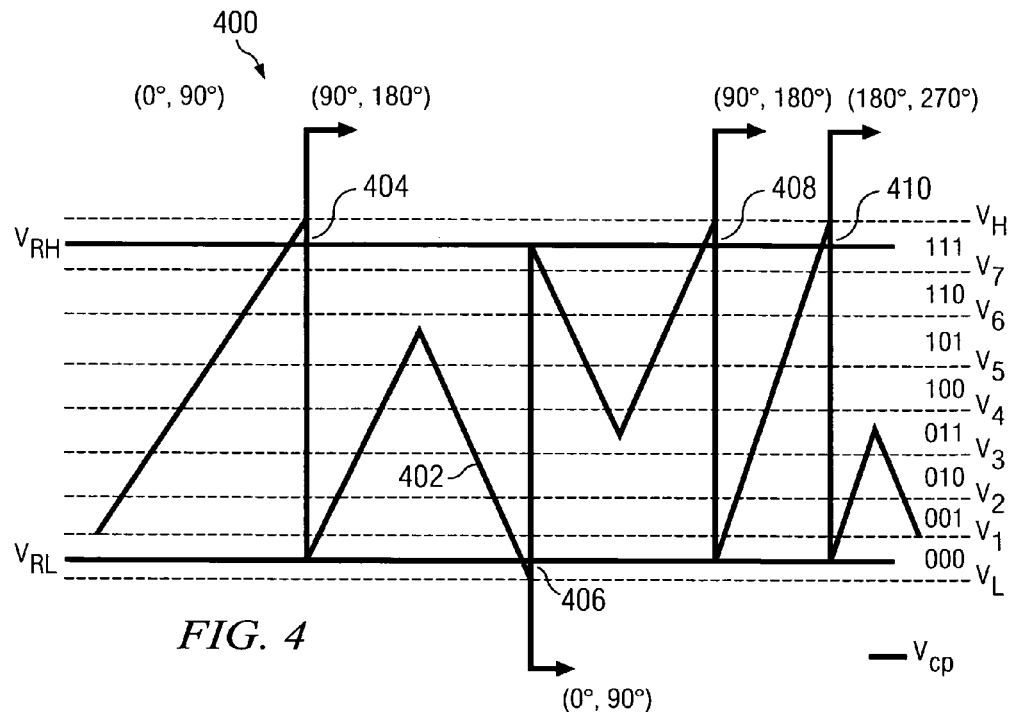
FIG. 4 is an illustrative example of signals sent from a charge pump in FIG. 3.

In FIG. 4, an illustrative example of voltages across a capacitor in response to signals sent from charge pump 302 in FIG. 3 is depicted. Graph 400 illustrates voltage levels across capacitor 304 in FIG. 3. In this particular illustrative example, capacitor 304 is a 1 pF capacitor and the charge pump current is set to 20 µA. As can be seen, the output represented has a one volt range with the lowest level of this one volt range being represented by $V_L$, while the upper end of the one volt range is represented by $V_H$. The voltage across capacitor 304 is represented by line 402 in FIG. 4. The voltage across capacitor 304 changes as an up or down signal is generated by charge pump 302. In these examples, a thermometer coding or a Gray coding is employed to avoid abrupt bit changes, such as a change from 111 to 000. Because the charge pump has a voltage output range of one volt in this example, the integrated analog voltage in capacitor 304 needs to be preset or reset whenever the boundary of this voltage range is reached.

For example, when level detector 310 detects that the capacitor voltage, Vcp, across capacitor 304 reaches a maximum level, $V_H$, the voltage across capacitor 304 is reset to a level near that of the "000" state. This reset low voltage level is referred to as voltage $V_{RL}$. In graph 400, this threshold level and phase boundary advance occurs at point 404. At the same time, the phase boundary advances from (0°, 90°) to (90°, 180°). The advance in phase boundary can be thought of as a carry signal while the capacitor voltage can be thought of as the fine-grain representation of the phase. As can be seen, the voltage moves up and down as represented by line 402 until point 406 is reached. At this point, the voltage has passed the lower threshold value, voltage $V_L$. At that point, the voltage is reset to a level near that of the "111" state. This reset high voltage level is referred to as voltage $V_{RH}$. This reset at point 406 occurs after another 50 ns has passed. Additional voltage resets occur at points 408 and 410 with the voltages being reset to voltage $V_{RL}$ when the upper voltage threshold level $V_H$ is reached within the one volt range used in this illustrative example.

In comparing this approach to a conventional digital FSM implementation, the capacitor voltage across capacitor 304 is analogous to the content of a digital accumulator. The reset signal is analogous to the carry output of a digital accumulator. With a charge pump current of about 20 µA at a capacitor value of 1 pF, the update period of state machine 308 or level detector 310 is about 50 ns. Therefore, the power consumption of digital blocks in AFSM 300 is negligible and is far less than the power consumption associated with the conventional digital approach.

Figure 5:
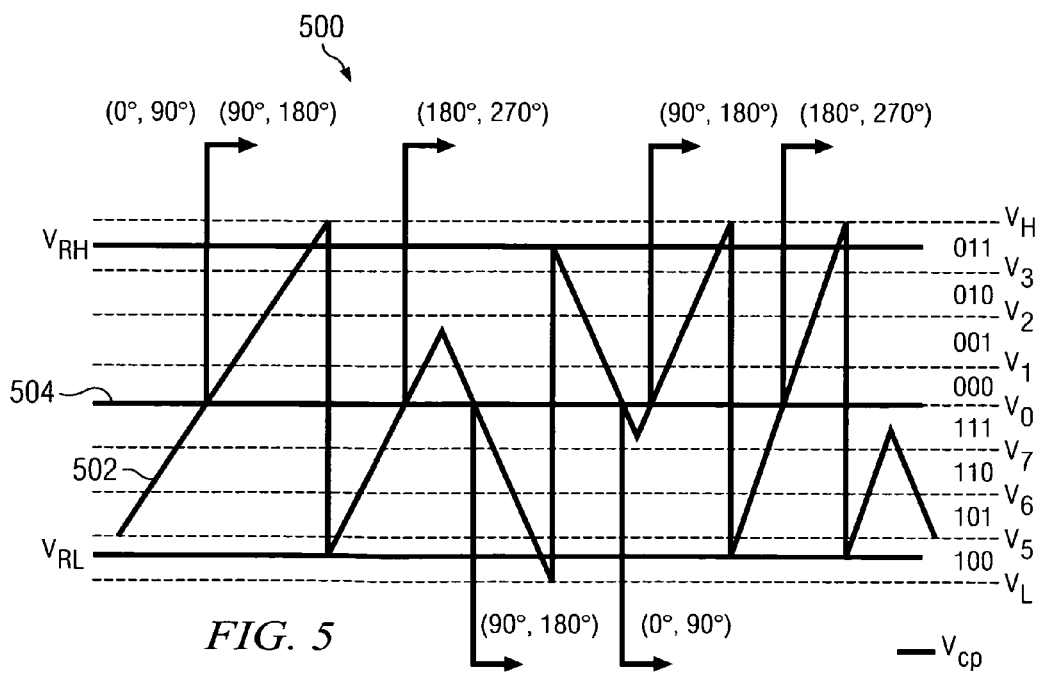
FIG. 5 is a diagram illustrating an enhanced coding scheme in an AFSM in accordance with an illustrative embodiment.

Turning next to FIG. 5, a diagram illustrating an enhanced coding scheme in an AFSM is depicted in accordance with an illustrative embodiment. In this illustrative example, graph 500 represents a voltage across capacitor 304 with this voltage being represented by line 502. In these examples, the upper voltage level within the voltage range is set to be state "011", represented by voltage $V_3$. The lower threshold level is set by state "100", represented by voltage $V_4$. By shifting the interpolation bit, the phase boundary selection can be placed arbitrarily with respect to the integration reset of the voltages. In this manner, the resetting of voltages in capacitor 304 may be performed such that the reset does not occur with the phase boundary selection. As can be seen, phase boundary selection in these examples occurs when the voltage crosses a level along line 504 equal to voltage $V_0$ The resetting of the voltages occurs when the threshold levels $V_H$ and $V_L$ are encountered. This occurs by offsetting the voltages such that state "100" is set for the lower level of the one voltage range from the charge pump while state "011" is set for the upper level of the one voltage range from the charge pump in these illustrative examples. Further, the worst case algorithmic jitter may be kept within the 1 least significant bit range, that is $\frac{1}{32}$ of the clock period.

Figure 6:
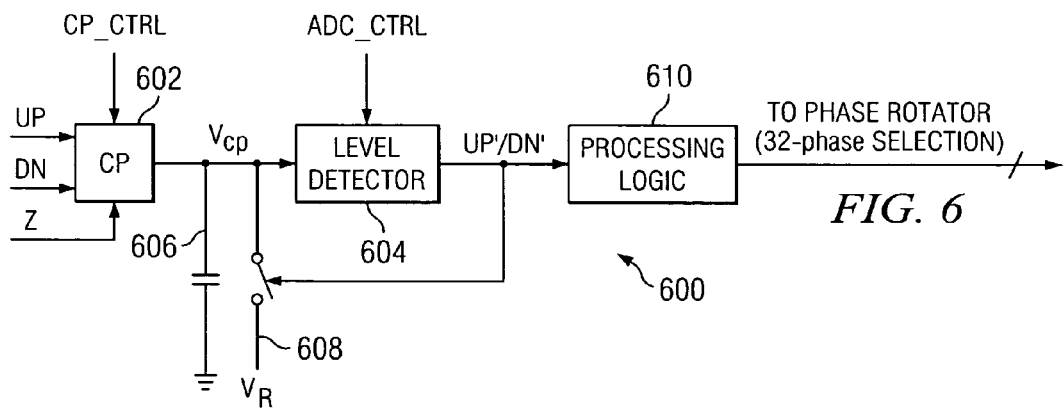
FIG. 6 is a diagram illustrating a 1.5 bit ADC scheme for an AFSM according to an illustrative embodiment
Figure 7:
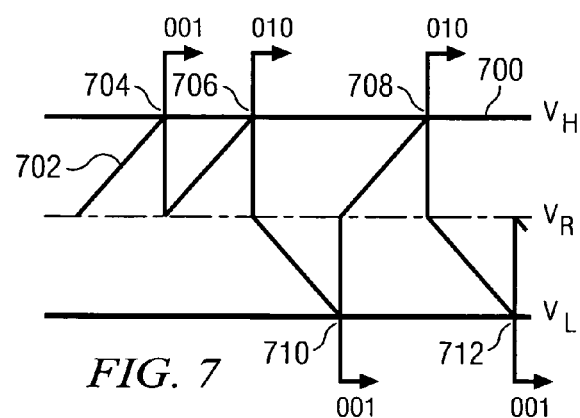
FIG. 7 is an illustrative example of signals sent from a charge pump in FIG. 6.

Alternatively, a 1.5-bit ADC may be employed in another illustrative embodiment. Turning now to FIG. 6, a diagram illustrating a 1.5 bit ADC scheme for an AFSM is depicted according to another illustrative embodiment. Analog-based finite state machine 600 includes charge pump 602, level detector 604, capacitor 606, switch 608, and processing logic 610. With this configuration, only a single switch, switch 608 is required. This switch resets the voltage to voltage $V_R$. As can be seen, in FIG. 7, a diagram illustrating voltages for a level detector using a 1.5 bit ADC scan is depicted in accordance with a preferred embodiment. In this diagram, voltages $V_H$ and $V_L$ are used as threshold voltages to determine whether a phase advance or phase retard signal is generated by the ADC for processing in the processing logic.

In these examples, phase selection occurs when the voltage represented by line 702 reaches voltage $V_H$ as shown at points 704, 706, and 708. Additionally, phase selection also occurs at points 710 and 712 when the voltage across the capacitor reaches the lower voltage threshold level, $V_L$. The reset of the voltage in these examples is to voltage $V_R$, which is chosen to be midway between $V_H$ and $V_L$. Using a 1.5 bit ADC enables the use of a smaller integration capacitor and/or could require a smaller voltage change during reset.

In this manner, the AFSM architecture illustrated in AFSM 300 in FIG. 3 works well with full and sub-rate clock signals being provided to the phase rotator. Of course, other programmable delay elements may be used in place of the phase rotator. Additionally, greater power savings are derived when the clock used in a digital FSM implementation is at a higher frequency.

Figure 8:
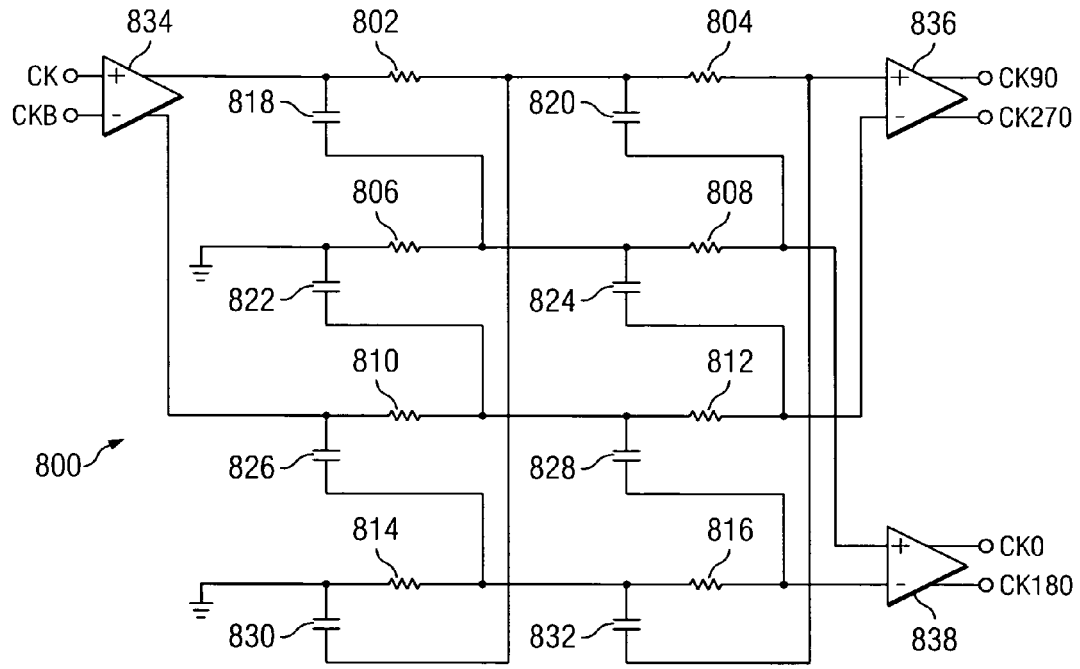
FIG. 8 is a diagram illustrating a circuit used for a full-rate multiphase generation method using a polyphase filter in accordance with an illustrative embodiment.

Turning now to FIG. 8, a diagram illustrating a circuit used to implement a full-rate multiphase generation method using a polyphase filter is illustrated in accordance with an illustrative embodiment. This diagram illustrates a mechanism used for generating appropriate quadrature inputs for a phase rotator from a single full-rate clock input.

As can be seen, polyphase filter 800 includes resistors 802, 804, 806, 808, 810, 812, 814, and 816. These resistors are interconnected with capacitors 818, 820, 822, 824, 826, 828, 830, and 832. Additionally, polyphase filter 800 also includes amplifiers 834, 836, and 838. Amplifier 834 receives complementary signals clock and clock_bar at its inputs. Amplifier 836 generates a 90° clock signal and a 270° signal, while amplifier 838 generates a 0° clock signal and a 180° clock signal. In this manner, four different phases may be generated from a clock signal.

Polyphase filter 800 is a passive filter using only resistors and capacitors, with the RC network outputs passed to amplification stages. Further, this proposed method does not require a multiphase clock output from the PLL. As a result, polyphase filter 800 may work with a PLL having an LC voltage controlled oscillator (which typically has only a pair of outputs at phases 0° and 180°) as well as a PLL having a ring-based voltage controlled oscillator. Polyphase filter 800 maintains relative phase information over a broad frequency range, because the phase mismatch is determined by passive elements' matching. The gain mismatch problem in the quadrature outputs is mitigated using this polyphase technology. This architecture still requires a good limiting amplifier to reduce amplitude modulation to phase modulation conversion and to compensate for signal attenuation.

Figure 9:
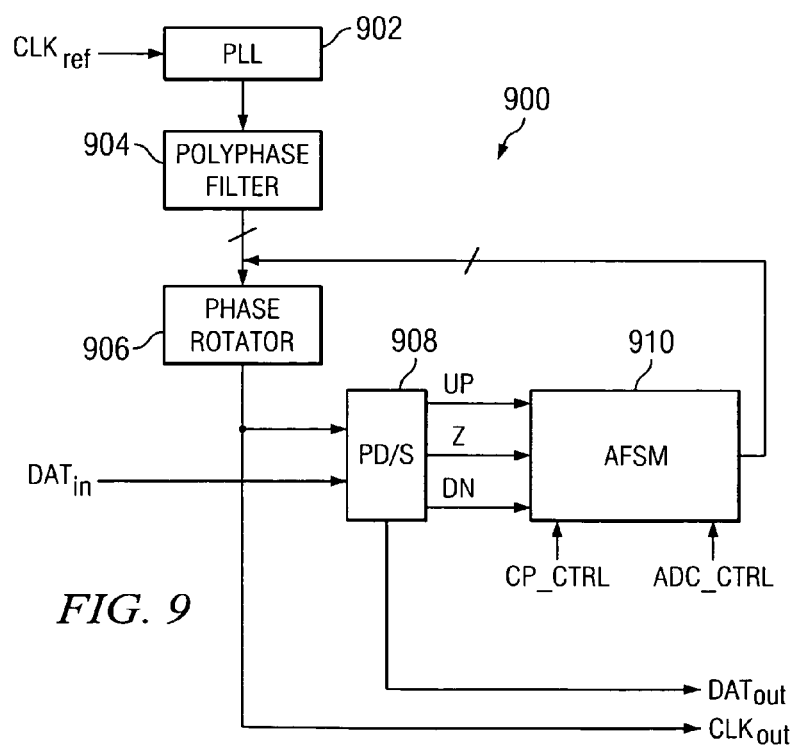
FIG. 9 is a diagram illustrating a full-rate semidigital delay-locked loop circuit in accordance with an illustrative embodiment.

Turning next to FIG. 9, a diagram illustrating a full-rate semidigital delay-locked loop circuit is depicted in accordance with an illustrative embodiment. Semidigital delay-locked loop circuit 900 receives a clock reference signal through phase locked loop (PLL) circuit 902, which is turned into a four phase clock signal by polyphase filter 904. The output of this filter is input into phase rotator 906 in semidigital delay-locked loop circuit 900. The output of this circuit is connected to the input of phase detector/sampler (PD/S) 908, which also receives a digital data stream, $DAT_{in}$. Phase detector/sampler 908 generates an up signal, a down signal, and a tristate signal, which are sent to analog-based finite state machine (AFSM) 910. AFSM 910 provides control information for phase rotator 906. Essentially, semidigital delay-locked loop 900 is similar to semidigital delay-locked loop 200 in FIG. 2, except for the use of polyphase filter 904 to generate a 4 phase signal. As mentioned before, AFSM 910 provides a path to low-power operation by eliminating high frequency digital blocks. Polyphase filter 904 enables this circuit to work with a single full-rate clock input. In this manner, semidigital delay-locked loop circuit 900 provides full-rate CDR with a single differential clock input for each channel. Additionally, only one phase rotator is required for each channel in this illustrative embodiment.

Further, this circuit is more immune to deterministic jitter since multiphase high-frequency clock distribution is avoided. Moreover, excellent control of the loop bandwidth can be provided using the programmable charge pump in AFSM 910.

Thus, the AFSM architecture in the illustrative embodiments uses low power analog blocks to map high frequency loop feedback information to a low frequency. In this manner, the total power required for digital signal processing is reduced. This AFSM approach in the illustrative embodiments may be implemented using ADCs with varying numbers of bits. Finally, through the use of a polyphase filter, a quadrature set of clock signals may be generated from a single clock signal input. This component provides one way in which a phase rotator may be driven even when the clock source PLL uses a full-rate LC-based voltage controlled oscillator.

The description of the present invention has been presented for purposes of illustration and description, and is not intended to be exhaustive or limited to the invention in the form disclosed. Many modifications and variations will be apparent to those of ordinary skill in the art. The illustrative embodiments were chosen and described in order to best explain the principles of the invention, the practical application, and to enable others of ordinary skill in the art to understand the invention for various embodiments with various modifications as are suited to the particular use contemplated.

What is claimed is:

1. A semidigital delay-locked loop circuit comprising:
   a controllable delay element having a clock input and a phase input, and a clock signal output, wherein signals on the clock signal output have a changing phase controlled by phase data received at the phase input;
   a phase detector, a first input, a second input, an up output, a down output, and a data output, wherein data is received at the first input, the second input is connected to the clock signal output, and wherein the phase detector generates up signals through the up output and down signals through the down output in response to data received at the first input; and
   an analog based finite state machine having an up input connected to the up output, a down input connected to the down output, and phase output connected to the phase input of the controllable delay element, wherein the analog based finite state machine generates the phase data in response to up signals and down signals received from the phase detector.

2. The semidigital delay-locked loop circuit of claim 1, wherein the phase data includes data for phase interpolation and data for phase selection.

3. The semidigital delay-locked loop circuit of claim 1, wherein the analog based finite state machine comprises:
   a charge pump; and
   a logic unit.

4. The semidigital delay-locked loop circuit of claim 3, wherein the logic unit comprises:
   an analog to digital converter, wherein the analog to digital converter generates a logic signal in response to a voltage signal from the charge pump;
   a level detector, wherein the level detector generates a first signal and a second signal in response to voltage level changes in the voltage signal from the charge pump; and
   a state machine, wherein the state machine generates a phase logic signal in response to first signal and the second signal.

5. The semidigital delay-locked loop circuit of claim 4, wherein the analog to digital converter has a 3 bit output.

6. The semidigital delay-locked loop circuit of claim 4, wherein the state machine has a state that changes states in response to the first signal and the second signal and the logic signal is generated in response to the state of the state of the state machine.

7. The semidigital delay-locked loop circuit of claim 6, wherein the state machine has four states.

8. The semidigital delay-locked loop circuit of claim 7, wherein the state machine generates a "00" signal in a first state, a "01" signal in a second state, a "10" signal in a third state, and a "11" signal in a fourth state.

9. The semidigital delay-locked loop circuit of claim 1 further comprising:
a polyphase filter having an input for receiving the clock signal and an output connected to the clock input of the phase rotator, wherein the polyphase filter generates four clock signals in which each clock signal has a different phase.

10. The semidigital delay-locked loop circuit of claim 9, wherein the polyphase filter includes a plurality of capacitors and a plurality of resistors.

11. The semidigital delay-locked loop circuit of claim 9 further comprising:
a clock circuit having an input and an output, wherein the input of the clock circuit is connected to a clock signal and wherein the output of the clock circuit is connected to the input of the polyphase filter.

12. The semidigital delay-locked loop circuit of claim 11, wherein the clock circuit is a phase locked-loop circuit.

13. The semidigital delay-locked loop circuit of claim 11, wherein the clock circuit is a delay locked-loop circuit.

14. The semidigital delay-locked loop circuit of claim 1, wherein the phase detector has tristate operation.

15. The semidigital delay-locked loop circuit of claim 1, wherein the controllable delay element is a phase rotator.

16. The semidigital delay-locked loop circuit of claim 4, wherein the analog to digital converter is a 1.5 bit analog to digital converter.

* * * * *

UNITED STATES PATENT AND TRADEMARK OFFICE
CERTIFICATE OF CORRECTION

PATENT NO. : 6,927,611 B2
DATED : August 9, 2005
INVENTOR(S) : Rhee et al.

It is certified that error appears in the above-identified patent and that said Letters Patent is hereby corrected as shown below:

<u>Column 8,</u>
Line 56, after "claim" delete "3" and insert -- 1 --.

<u>Column 10,</u>
Line 15, after "claim" delete "4" and insert -- 1 --.

Signed and Sealed this

Twenty-eighth Day of March, 2006

JON W. DUDAS
*Director of the United States Patent and Trademark Office*